United States Patent
Jung et al.

(10) Patent No.: US 11,056,546 B2
(45) Date of Patent: Jul. 6, 2021

(54) DISPLAY DEVICE AND METHOD OF MANUFACTURING DISPLAY DEVICE

(71) Applicant: Samsung Display Co., Ltd., Yongin-si (KR)

(72) Inventors: Jin Whan Jung, Yongin-si (KR); Hyeon Bum Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/428,753

(22) Filed: May 31, 2019

(65) Prior Publication Data

US 2020/0066804 A1 Feb. 27, 2020

(30) Foreign Application Priority Data

Aug. 22, 2018 (KR) .......................... 10-2018-0098045

(51) Int. Cl.
 *H01L 27/32* (2006.01)
 *H01L 51/52* (2006.01)
 (Continued)

(52) U.S. Cl.
 CPC .......... *H01L 27/323* (2013.01); *G06F 3/0412* (2013.01); *G06F 3/0445* (2019.05);
 (Continued)

(58) Field of Classification Search
 CPC . H01L 27/323; H01L 27/3246; H01L 27/322; H01L 51/5253; H01L 51/5275;
 (Continued)

(56) References Cited

U.S. PATENT DOCUMENTS 8,963,138 B2 * 2/2015 Lim .................... H01L 51/5275
 257/40
9,280,242 B2 3/2016 Choung et al.
(Continued)

FOREIGN PATENT DOCUMENTS

JP 2016-1457 A 1/2016
JP 2016-81529 A 5/2016
(Continued)

OTHER PUBLICATIONS

United States Patent and Trademark Office Action for corresponding U.S. Appl. No. 15/916,973, dated Jun. 27, 2019, 29 pages.
(Continued)

*Primary Examiner* — Mihir K Rayan
(74) *Attorney, Agent, or Firm* — Lewis Roca Rothgerber Christie LLP

(57) ABSTRACT

A display device includes a display panel and a touch sensor on the display panel. The display panel includes: a base layer; a light emitting element having a first electrode on the base layer; a pixel defining layer including an opening region that exposes a portion of the first electrode of the light emitting element; and an encapsulation layer covering the light emitting element and the pixel defining layer. The touch sensor has: a first conductive pattern on the encapsulation layer; a color filter on the encapsulation layer to cover the first conductive pattern, the color filter including a first region including a lens part and overlaps the opening region of the pixel defining layer and a second region overlaps the pixel defining layer; a second conductive pattern on the second region of the color filter; and a black matrix on the second conductive pattern.

16 Claims, 9 Drawing Sheets

(51) Int. Cl.
  *G06F 3/041* (2006.01)
  *H01L 51/56* (2006.01)
  *G06F 3/044* (2006.01)

(52) U.S. Cl.
  CPC ........ *H01L 27/322* (2013.01); *H01L 27/3246* (2013.01); *H01L 51/5253* (2013.01); *H01L 51/5275* (2013.01); *H01L 51/5284* (2013.01); *H01L 51/56* (2013.01); *G06F 2203/04103* (2013.01); *H01L 2227/323* (2013.01)

(58) Field of Classification Search
  CPC ................. H01L 51/5284; H01L 51/56; H01L 2227/323; G06F 3/0412; G06F 3/0445; G06F 2203/04103
  See application file for complete search history.

(56) References Cited

U.S. PATENT DOCUMENTS

| | | | |
|---|---|---|---|
| 9,983,702 B2 | 5/2018 | Nakamura et al. | |
| 10,082,924 B2 | 9/2018 | Kim et al. | |
| 2005/0255392 A1* | 11/2005 | Tsai | G02B 5/201 430/7 |
| 2007/0048633 A1* | 3/2007 | Hsu | G02B 5/201 430/7 |
| 2011/0284898 A1* | 11/2011 | Iwasaki | H01L 27/322 257/98 |
| 2012/0217521 A1* | 8/2012 | Ohta | H01L 51/5275 257/89 |
| 2013/0341651 A1 | 12/2013 | Kim et al. | |
| 2014/0027725 A1* | 1/2014 | Lim | H01L 51/5275 257/40 |
| 2014/0339509 A1* | 11/2014 | Choi | H01L 51/5275 257/40 |
| 2015/0048333 A1* | 2/2015 | Choi | H01L 51/5275 257/40 |
| 2015/0049030 A1* | 2/2015 | Her | G06F 3/0412 345/173 |
| 2015/0115254 A1 | 4/2015 | Choi et al. | |
| 2015/0153862 A1 | 6/2015 | Nakamura et al. | |
| 2015/0187857 A1 | 7/2015 | Negishi et al. | |
| 2015/0243930 A1* | 8/2015 | Kim | H01L 51/5284 257/40 |
| 2015/0277187 A1 | 10/2015 | Akasaka | |
| 2016/0018922 A1* | 1/2016 | Wang | G06F 3/044 345/174 |
| 2016/0035795 A1* | 2/2016 | Lim | H01L 27/322 257/40 |
| 2016/0109998 A1 | 4/2016 | Watanabe | |
| 2017/0097707 A1 | 4/2017 | Kim et al. | |
| 2019/0051711 A1 | 2/2019 | Lee et al. | |

FOREIGN PATENT DOCUMENTS

| | | |
|---|---|---|
| JP | 6429606 B2 | 11/2018 |
| KR | 10-2014-0100091 A | 8/2014 |
| KR | 10-2015-0007062 A | 1/2015 |
| KR | 10-2015-0057019 A | 5/2015 |
| KR | 10-2016-0073533 A | 6/2016 |
| KR | 10-2017-0040423 A | 4/2017 |

OTHER PUBLICATIONS

Extended European Search Report dated Nov. 27, 2018 for EP Patent Application No. 18180192.9, 8pp.

* cited by examiner

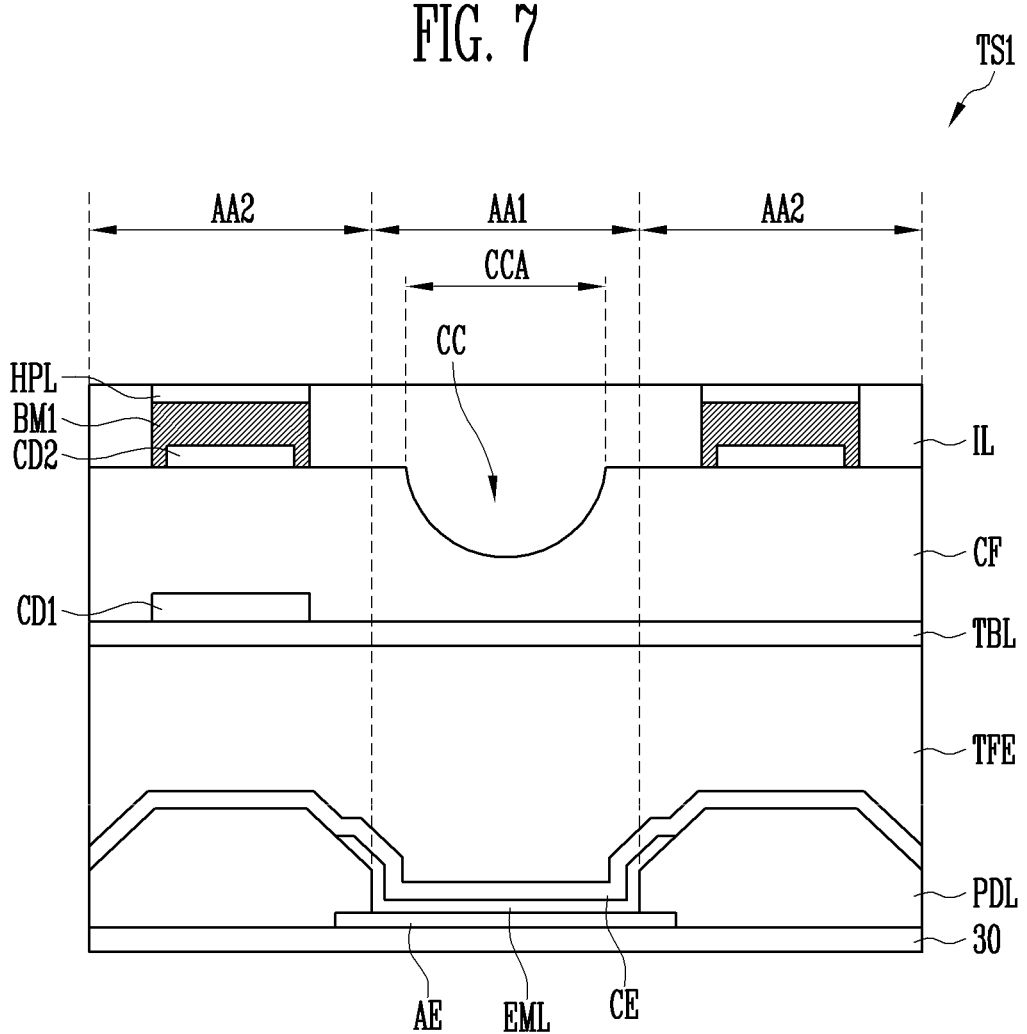

DISPLAY DEVICE AND METHOD OF MANUFACTURING DISPLAY DEVICE

CROSS-REFERENCE TO RELATED APPLICATION

The present application claims priority to and the benefit of Korean patent application No. 10-2018-0098045 filed on Aug. 22, 2018 in the Korean Intellectual Property Office, the entire disclosure of which is incorporated herein by reference.

BACKGROUND

1. Field

The present disclosure generally relates to a display device, and more particularly, to a touch sensor, a display device including the same, and a method of manufacturing a display device including a touch sensor.

2. Description of the Related Art

A display device has recently been developed to have an information input function in addition to an image display function. The information input function of the display device may generally be implemented with a touch sensor for receiving a touch input from a user or a touch input from a tool (e.g., a predetermined tool such as a stylus).

The touch sensor may be attached to one surface of a display panel for implementing the image display function, or be integrally formed with the display panel. A user may input information by pressing or touching the touch sensor while viewing an image being displayed by the display panel.

The touch sensor may be included with not only flat panel display devices but also with flexible display devices, curved display devices, foldable display devices, bendable display devices, and/or the like.

Studies for decreasing thicknesses of the display panel and the touch sensor have been conducted so as to freely modify the shape of the display device.

SUMMARY

Embodiments provide a touch sensor including a color filter having a lens shape between a first sensing electrode and a second sensing electrode.

Embodiments also provide a display device including the touch sensor.

Embodiments also provide a method of manufacturing the touch sensor.

According to an aspect of the present disclosure, there is provided a display device including: a display panel having an emission region and a non-emission region; and a touch sensor on the display panel. The display panel includes: a base layer; a light emitting element on the base layer, the light emitting element having a first electrode; a pixel defining layer having an opening region that exposes a portion of the first electrode of the light emitting element; and an encapsulation layer covering the light emitting element and the pixel defining layer, wherein the touch sensor includes: a first conductive pattern on the encapsulation layer; a color filter on the encapsulation layer to cover the first conductive pattern, the color filter including a first region including a lens part and overlaps with the opening region of the pixel defining layer and a second region overlaps with the pixel defining layer; a second conductive pattern on the second region of the color filter; and a black matrix on the second conductive pattern.

The lens part of the color filter may have a concave lens shape that is concave toward the light emitting element.

The width of the black matrix may be smaller than that of the pixel defining layer overlapping with the black matrix.

The black matrix may cover a side surface of the second conductive pattern.

The width of the lens part may be smaller than that of the opening region of the pixel defining layer that overlaps with the lens part.

The lens part of the color filter may have a convex lens shape that protrudes further than the second region.

The width of the black matrix may be larger than that of the pixel defining layer overlapping with the black matrix.

The black matrix may overlap with a portion of the opening region of the pixel defining layer.

The width of the lens part may be smaller than that of the opening region of the pixel defining layer that overlaps with the lens part.

The touch sensor may further include: a hydrophobic layer on the black matrix; and an insulating layer on the color filter.

The insulating layer may not overlap with the second conductive pattern, the black matrix, and the hydrophobic layer.

The color filter may include a contact hole that is located in the second region and exposes a portion of the first conductive pattern.

The first conductive pattern may be electrically connected to the second conductive pattern through the contact hole.

The light emitting element may further include: a second electrode on the first electrode; and an emitting layer between the first electrode and the second electrode.

The pixel defining layer may cover a portion of the first electrode, and the opening region of the pixel defining layer may correspond to a portion of the first electrode, which is exposed from the pixel defining layer.

According to another aspect of the present disclosure, there is provided a method of manufacturing a display device, the method including: patterning a first conductive pattern on a display panel; forming the display panel and a color filter through a photo process, wherein the color filter includes a first region including a lens part on the first conductive pattern, a second region at the periphery of the first region, and a contact hole formed at a portion of the second region; patterning a second conductive pattern on the second region of the color filter; forming a black matrix on the second conductive pattern; forming a hydrophobic layer on the black matrix; and forming an insulating layer at a portion of the color filter, which is exposed from the second conductive pattern and the black matrix.

The insulating layer may be formed through an inkjet printing process. The insulating layer may not overlap with the second conductive pattern, the black matrix, and the hydrophobic layer.

The lens part of the color filter may have a concave lens shape that is concave toward the display panel.

The lens part of the color filter may have a convex lens shape that protrudes further than the second region.

BRIEF DESCRIPTION OF THE DRAWINGS

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the example embodiments to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

FIG. 7 is a sectional view illustrating an example of the touch sensor included in the display device of FIG. 2.

DETAILED DESCRIPTION

Figure 1:
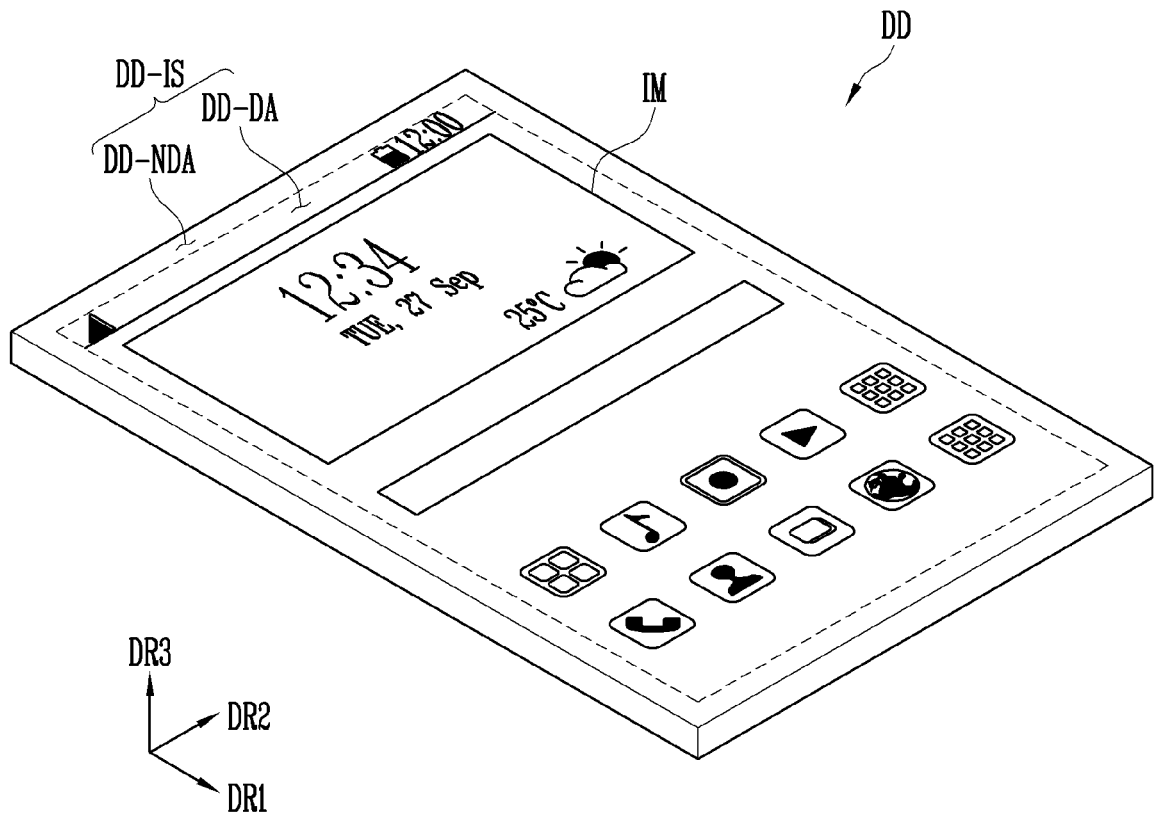
FIG. 1 is a perspective view illustrating a display device according to an embodiment of the present disclosure.

Hereinafter, example embodiments will be described in more detail with reference to the accompanying drawings, in which like reference numbers refer to like elements throughout. The present invention, however, may be embodied in various different forms, and should not be construed as being limited to only the illustrated embodiments herein. Rather, these embodiments are provided as examples so that this disclosure will be thorough and complete, and will fully convey the aspects and features of the present invention to those skilled in the art. Accordingly, processes, elements, and techniques that are not necessary to those having ordinary skill in the art for a complete understanding of the aspects and features of the present invention may not be described. Unless otherwise noted, like reference numerals denote like elements throughout the attached drawings and the written description, and thus, descriptions thereof will not be repeated. In the drawings, the relative sizes of elements, layers, and regions may be exaggerated for clarity.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present invention.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

It will be understood that when an element or layer is referred to as being "on," "connected to," or "coupled to" another element or layer, it can be directly on, connected to, or coupled to the other element or layer, or one or more intervening elements or layers may be present. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments only and is not intended to be limiting of the present invention. As used herein, the singular forms "a" and "an" are intended to include the plural forms as well, unless the context clearly indicates otherwise. It will be further understood that the terms "comprises," "comprising," "includes," and "including," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list.

As used herein, the term "substantially," "about," and similar terms are used as terms of approximation and not as terms of degree, and are intended to account for the inherent deviations in measured or calculated values that would be recognized by those of ordinary skill in the art. Further, the use of "may" when describing embodiments of the present invention refers to "one or more embodiments of the present invention." As used herein, the terms "use," "using," and "used" may be considered synonymous with the terms "utilize," "utilizing," and "utilized," respectively. Also, the term "exemplary" is intended to refer to an example or illustration.

The electronic or electric devices and/or any other relevant devices or components according to embodiments of the present invention described herein may be implemented utilizing any suitable hardware, firmware (e.g. an application-specific integrated circuit), software, or a combination of software, firmware, and hardware. For example, the various components of these devices may be formed on one integrated circuit (IC) chip or on separate IC chips. Further, the various components of these devices may be implemented on a flexible printed circuit film, a tape carrier package (TCP), a printed circuit board (PCB), or formed on one substrate.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein. FIG. 1 is a perspective view illustrating a display device DD according to an embodiment of the present disclosure.

The display device DD may display an image IM through a display surface DD-IS. The display surface DD-IS is parallel to a surface defined by a first directional axis DR1 and a second directional axis DR2. A normal direction of the display surface DD-IS, i.e., a thickness direction of the display device DD, indicates a third directional axis DR3.

A front surface (or a top surface) and a back surface (or a bottom surface) of each member, layer or unit described hereinbelow are distinguished by the third directional axis DR3. However, the first to third directional axes DR1, DR2, and DR3 are merely illustrative, and the directions indicated by the first to third directional axes DR1, DR2, and DR3 are relative concepts, and may be changed into other directions. Hereinafter, first to third directions are directions respectively indicated by the first to third directional axes DR1, DR2, and DR3, and are designated by like reference numerals.

The display device DD may have a planar display surface. The present disclosure is not limited thereto, and the display device DD according to embodiments of the present disclosure may have various types of display surfaces capable of displaying an image, such as a curved display surface, a flexible display surface, foldable display surface, bendable display surface, a stereoscopic display surface, or other types of display surfaces, as would be appreciated by those skilled in the art. When the display device DD according to an embodiment of the present disclosure has a stereoscopic display surface, the stereoscopic display surface may include, for example, a plurality of display regions that face different directions. For example, the stereoscopic display surface may be implemented with a polygonal pillar-shaped display surface.

The display device DD may be a flexible display device. For example, the display device DD may be applied to a foldable display device, a bendable display device, a rollable display device, and/or the like. The present disclosure is not limited thereto, and the display device DD may be a rigid display device.

A display device applicable to a mobile phone terminal is illustrated as an example of the display device shown in FIG. 1. However, this is merely illustrative, and the display device DD may be applied to large-sized electronic devices such as televisions, monitors, and electronic displays as well as medium-/small-sized electronic devices such as tablet PCs, navigation systems, game consoles, and smart watches. Also, the display device DD may be applied to wearable electronic devices such as head mounted displays.

As shown in FIG. 1, the display surface DD-IS may include a display region DD-DA in which the image IM is displayed and a non-display region DD-NDA adjacent to the display region DD-DA. The non-display region DD-NDA is a region in which the image IM is not displayed. The non-display region DD-NDA may be disposed at the periphery of the display region DD-DA.

Figure 2:
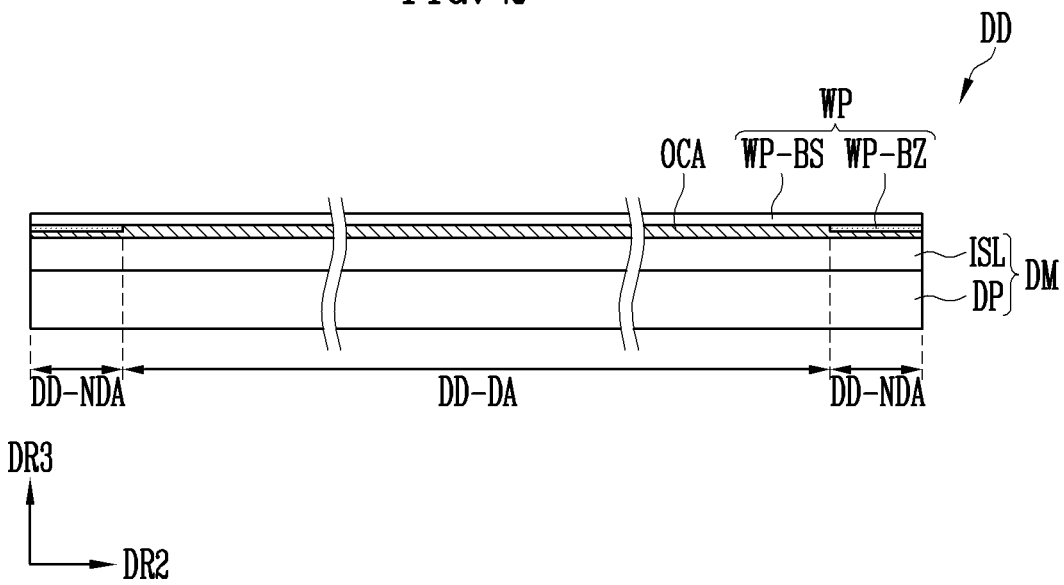
FIG. 2 is a sectional view schematically illustrating a display device according to an embodiment of the present disclosure.

FIG. 2 is a sectional view schematically illustrating a display device according to an embodiment of the present disclosure.

FIG. 2 is simply illustrated to describe stacking relationships between a functional panel and/or functional units, which constitute the display devices.

Referring to FIG. 2, the display device DD may include a display panel, a touch sensor, and a window unit. At least some components among the display panel, the touch sensor, and the window unit may be formed by a continuous process, or be coupled to each other through an adhesive member. The adhesive member may include a general adhesive, gluing agent, or other binding or attachment mechanism as would be understood by those skilled in the art. The adhesive member shown in FIG. 2 may be, for example, an optically transparent adhesive member OCA.

In an embodiment, the touch sensor may sense a contact or input of an external medium such as a finger, hand, stylus, or pen with respect to a display surface DD-IS.

In FIG. 2, a corresponding component formed with another component through a continuous process between the touch sensor and the window unit is expressed as a "layer." A corresponding component coupled to another component through an adhesive member between the touch sensor and the window unit is expressed as a "panel." The "panel" includes a base layer that provides a base surface, e.g., a synthetic resin film, a composite material film, a glass substrate, and the like, but the base layer may be omitted in the "layer." In other words, the units each expressed as the "layer" are disposed on a base surface provided by another unit.

The touch sensor and the window unit may be designated as a touch panel and a window panel WP or a touch sensor layer ISL and a window layer according to whether a base layer is present.

As shown in FIG. 2, the display device DD according to the embodiment of the present disclosure may include a display panel DP, a touch sensor layer ISL, and a window panel WP.

In an embodiment, the touch sensor layer ISL may be directly disposed on the display panel DP. In this specification, "that component A is directly disposed on component B" may mean that any separate adhesive layer/adhesive member is not disposed between the component A and the component B. The component B may be formed on a base surface provided by the component A through a process (e.g., a continuous process) after the component A is formed.

The display panel DP and the touch sensor layer ISL disposed on the display panel DP may be collectively defined as a display module DM. An optically transparent adhesive member OCA may be disposed between the display module DM and the window panel WP. That is, the optically transparent adhesive member OCA may be disposed between the display module DM and the window panel WP to allow the display module DM and the window panel WP to be attached to each other.

The touch sensor layer ISL may be disposed in the display panel DP or on the display panel DP.

In an embodiment of the present disclosure, the display panel DP may be a light emitting display panel, but the present disclosure is not particularly limited thereto. For example, the display panel DP may be an organic light emitting display panel, a quantum dot light emitting display panel, a microLED display panel, or any other suitable display panel.

In an embodiment, the window panel WP may include a base film WP-BS and a light blocking pattern WP-BZ. The base film WP-BS may include a glass substrate and/or a synthetic resin film. The base film WP-BS is not limited to a single layer. For example, the base-film WP-BS may include two or more films coupled through an adhesive member.

The light blocking pattern WP-BZ partially overlaps with the base film WP-BS. The light blocking pattern WP-BZ may be disposed on a back surface of the base film WP-BS to define a bezel region, i.e., a non-display region DD-NDA (see FIG. 1) of the display device DD.

Although not separately shown, the window panel WP may further include a functional coating layer disposed on a top surface of the base film WP-BS. The functional coating layer may include an anti-fingerprint layer, an anti-reflection layer, a hard coating layer, and/or the like.

Figure 3:
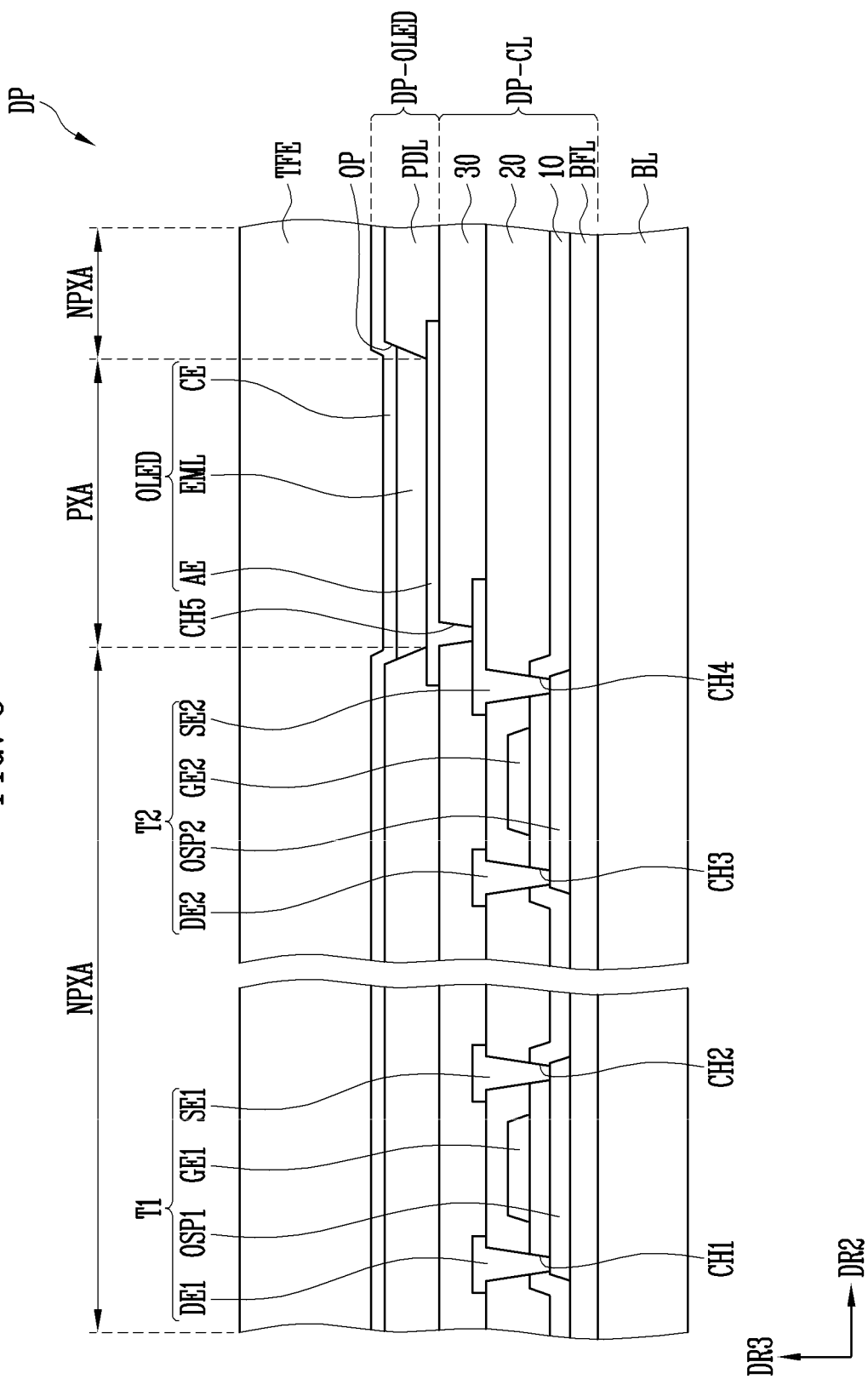
FIG. 3 is a sectional view illustrating an example of a display panel included in the display device of FIG. 2.

FIG. 3 is a sectional view illustrating an example of the display panel included in the display device of FIG. 2.

Referring to FIGS. 2 and 3, the display panel DP may include a base layer BL, a circuit element layer DP-CL, a display element layer DP-OLED, and an encapsulation layer TFE.

The base layer BL may include a synthetic resin film. The base layer BL may be a polyimide-based resin layer, but its material is not particularly limited thereto. In addition, the base layer BL may include a glass substrate, a metal substrate, an organic/inorganic complex material substrate, or any other suitable substrate as would be appreciated by one skilled in the art.

The circuit element layer DP-CL may include at least one insulating layer and at least one circuit element. Hereinafter, the insulating layer included in the circuit element layer DP-CL is referred to as an interlayer insulating layer. The interlayer insulating layer may include at least one interlayer inorganic layer and at least one interlayer organic layer. The circuit element may include a signal line, a driving circuit of a pixel, etc.

The circuit element layer DP-CL may include a buffer layer BFL, a first interlayer inorganic layer 10, and a second interlayer inorganic layer 20, which are inorganic layers, and may further include an interlayer organic layer 30 that is an organic layer. The materials of the inorganic layer and the organic layer are not particularly limited. In an embodiment of the present disclosure, the buffer layer BFL may be selectively disposed/omitted.

A semiconductor pattern OSP1 (hereinafter, referred to as a first semiconductor pattern) of a first transistor T1 and a semiconductor pattern OSP2 (hereinafter, referred to as a second semiconductor pattern) of a second transistor T2 are disposed on the buffer layer BFL. The first semiconductor pattern OSP1 and the second semiconductor pattern OSP2 may be selected from amorphous silicon, poly-silicon, and metal oxide semiconductor.

The first interlayer inorganic layer 10 is disposed over the first semiconductor pattern OSP1 (e.g., over at least a portion of the first semiconductor pattern OSP1) and the second semiconductor pattern OSP2. A control electrode GE1 (hereinafter, referred to as a first control electrode) of the first transistor T1 and a control electrode GE2 (hereinafter, referred to as a second control electrode) of the second transistor T2 are disposed on the first interlayer inorganic layer 10.

The second interlayer inorganic layer 20 covers the first control electrode GE1 and the second control electrode GE2 and may be disposed on the first interlayer inorganic layer 10. An input electrode DE1 (hereinafter, referred to as a first input electrode) and an output electrode SE1 (hereinafter, referred to as a first output electrode) of the first transistor T1 and an input electrode DE2 (hereinafter, referred to as a second input electrode) and an output electrode SE2 (hereinafter, referred to as a second output electrode) of the second transistor T2 are disposed on the second interlayer inorganic layer 20 (e.g., on at least a portion of the second interlayer inorganic layer 20).

The first input electrode DE1 and the first output electrode SE1 may be connected to the first semiconductor pattern OSP1 respectively through a first contact hole CH1 and a second contact hole CH2, which penetrate the first interlayer inorganic layer 10 and a second interlayer inorganic layer 20. The second input electrode DE2 and the second output electrode SE2 may be connected to the second semiconductor pattern OSP2 respectively through a third contact hole CH3 and a fourth contact hole CH4, which penetrate the first interlayer inorganic layer 10 and a second interlayer inorganic layer 20. In another embodiment of the present disclosure, at least one of the first transistor T1 and the second transistor T2 may be modified to have a bottom-gate structure as would be appreciated by those skilled in the art.

The interlayer organic layer 30 covering the first input electrode DE1, the second input electrode DE2, the first output electrode SE1, and the second output electrode SE2 is disposed on the second interlayer inorganic layer 20. The interlayer organic layer 30 may provide a planarization surface.

The display element layer DP-OLED is disposed on the interlayer organic layer 30. The display element layer DP-OLED may include a light emitting element. For example, the light emitting element may include an organic light emitting diode.

The display element layer DP-OLED may include a pixel defining layer PDL and an organic light emitting diode OLED. The pixel defining layer PDL may include an organic material. A first electrode AE may be disposed on the interlayer organic layer 30. The first electrode AE may be connected to the second output electrode SE2 through a fifth contact hole CH5 penetrating the interlayer organic layer 30. An opening region OP is defined by the pixel defining layer PDL. The opening region OP of the pixel defining layer PDL may expose at least a portion of the first electrode AE. In an embodiment, the first electrode AE may be an anode electrode of the organic light emitting diode OLED. However, this is merely illustrative, and the first electrode AE may be a cathode electrode of the organic light emitting diode OLED as those skilled in the art would appreciate.

A pixel may be disposed in the display region DP-DA. The display region DP-DA may include an emission region PXA and a non-emission region NPXA adjacent to the emission region PXA. The non-emission region NPXA may surround the emission region PXA. The emission region PXA may correspond to the opening region OP of the pixel defining layer PDL. The non-emission region NPXA may also correspond to the pixel defining layer PDL.

An emitting layer EML may be disposed on the first electrode AE. The emitting layer EML may be disposed in a region corresponding to the opening region OP. The emitting layer EML may generate a colored light (e.g., a light a predetermined color).

In an embodiment, the emitting layer EML may be commonly disposed in pixels (e.g., may be commonly formed). The emitting layer EML may generate white light. The emitting layer EML may have a multi-layered structure that is referred to as a tandem.

A second electrode CE is disposed on the emitting layer EML and the pixel defining layer PDL. The second electrode CE is commonly disposed in the pixels. In an embodiment, the second electrode CE may be a cathode electrode.

In an embodiment, the pixel may further include a hole control layer between the first electrode AE and the emitting layer EML and an electron control layer between the emitting layer EML and the second electrode CE. Each of the hole control layer and the electron control layer may be commonly disposed in the emission region PXA and the non-emission region NPXA. Although not separately shown, common layers such as the hole control layer and the electron control layer may be commonly formed in the pixels as one skilled in the art would appreciate.

The encapsulation layer TFE may be disposed over the second electrode CE. The encapsulation layer TFE is commonly disposed in the pixels. The encapsulation layer TFE may encapsulate the display element layer DP-OLED. The encapsulation layer TFE may include at least one insulating layer. In an embodiment of the present disclosure, the encapsulation layer TFE may include at least one inorganic layer (hereinafter, referred to as an encapsulation inorganic layer). In an embodiment, the encapsulation layer TFE may include at least one organic layer (hereinafter, referred to as an encapsulation organic layer) and at least one encapsulation inorganic layer.

The encapsulation inorganic layer may protect the display element layer DP-OLED from moisture/oxygen, and may also protect the display element layer DP-OLED from a foreign substance such as dust particles. The encapsulation inorganic layer may include a silicon nitride layer, a silicon oxynitride layer, a silicon oxide layer, a titanium oxide layer, an aluminum oxide layer, and/or the like. However, the present disclosure is not limited thereto, and the encapsulation inorganic layer may be made of any suitable inorganic material capable of protecting the display element layer from moisture/oxygen. The encapsulation organic layer may include an acryl-based organic layer. However, the present disclosure is not limited thereto, and the encapsulation organic layer may be made of an organic material capable of protecting the display element layer from a foreign substance such as dust particles.

Figure 4:
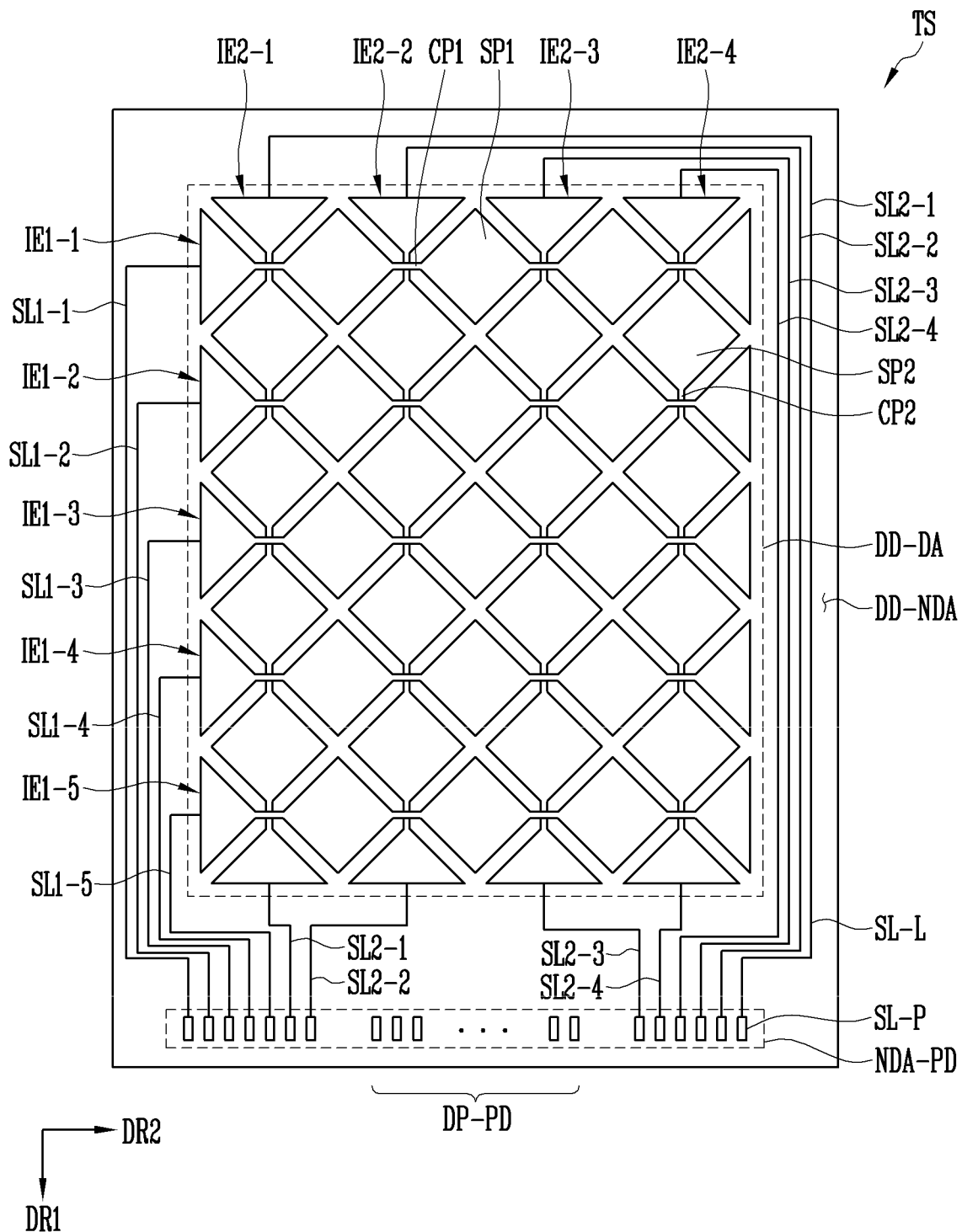
FIG. 4 is a plan view illustrating an example of a touch sensor included in the display device of FIG. 2.

FIG. 4 is a plan view illustrating an example of the touch sensor included in the display device of FIG. 2.

Referring to FIG. 4, the touch sensor TS may include first sensing electrodes IE1-1 to IE1-5, first signal lines SL1-1 to SL1-5 connected to the first sensing electrodes IE1-1 to IE1-5, second sensing electrodes IE2-1 to IE2-4, and second signal lines SL2-1 to SL2-4 connected to the second sensing electrodes IE2-1 to IE2-4.

In an embodiment, the touch sensor TS may further include an optical dummy electrode disposed in a boundary region between the first sensing electrodes IE1-1 to IE1-5 and the second sensing electrodes IE2-1 to IE2-4.

The first sensing electrodes IE1-1 to IE1-5 and the second sensing electrodes IE2-1 to IE2-4 cross each other. The first sensing electrodes IE1-1 to IE1-5 are arranged along a first direction DR1, and each of the first sensing electrodes IE1-1 to IE1-5 extends in a second direction DR2. The first sensing electrodes IE1-1 to IE1-5 and the second sensing electrodes IE2-1 to IE2-4 may sense an external input, using a mutual capacitance method and/or a self-capacitance method.

Each of the first sensing electrodes IE1-1 to IE1-5 includes first sensor parts SP1 and first connecting parts CP1. Each of the second sensing electrodes IE2-1 to IE2-4 includes second sensor parts SP2 and second connecting parts CP2.

In an embodiment, the first sensing electrodes IE1-1 to IE1-5 and the second sensing electrodes IE2-1 to IE2-4 may have a shape (e.g., a bar shape) in which the sensor part and the connecting part are not distinguished from each other. Although the first sensor parts SP1 and the second sensor parts SP2, which have a rhombus shape, are illustrated, the present disclosure is not limited thereto, and the first sensor parts SP1 and the second sensor parts SP2 may have any other suitable polygonal shape as would be appreciated by those skilled in the art.

In an embodiment, the first sensing electrodes IE1-1 to IE1-5 and the second sensing electrodes IE2-1 to IE2-4 may be formed in a mesh pattern.

The first sensor parts SP1 are arranged along the second direction in one first sensing electrode, and the second sensor parts SP2 are arranged along the first direction DR1 in one second sensing electrode. Each of the first connecting parts CP1 connects adjacent first sensor parts SP1, and each of the second connecting parts CP2 connects adjacent second sensor parts SP2.

In an embodiment, the first connecting parts CP1, the first sensor parts SP1, and the second sensor parts SP2 may be disposed on the same layer, and the second connecting parts CP2 may be disposed in a layer different from that of the first connecting parts CP1, the first sensor parts SP1, and the second sensor parts SP2. Accordingly, the first sensing electrodes IE1-1 to IE1-5 and the second sensing electrodes IE2-1 to IE2-4 are not in contact (e.g., short-circuited) to each other.

The first signal lines SL1-1 to SL1-5 are connected to one ends of the first sensing electrodes IE1-1 to IE1-5, respectively. The second signal lines SL2-1 to SL2-4 are connected to both ends of the second sensing electrodes IE2-1 to IE2-4. In an embodiment, the first signal lines SL1-1 to SL1-5 may be connected to both ends of the first sensing electrodes IE1-1 to IE1-5. In an embodiment, the second signal lines SL2-1 to SL2-4 may be connected to only one ends of the second sensing electrodes IE2-1 to IE2-4, respectively.

Each of the first signal lines SL1-1 to SL1-5 and the second signal lines SL2-1 to SL2-4 may include a line part SL-L and a pad part SL-P. The pad parts SL-P may be aligned in a pad region NDA-PD.

The touch sensor TS may include signal pads DP-PD. The signal pads DP-PD may be aligned in the pad region NDA-PD.

The planar shape of the touch sensor TS is not limited thereto and in various embodiments, the touch sensor TS may have any other suitable shapes and arrangements as those skilled in the art would appreciate.

Figure 5:
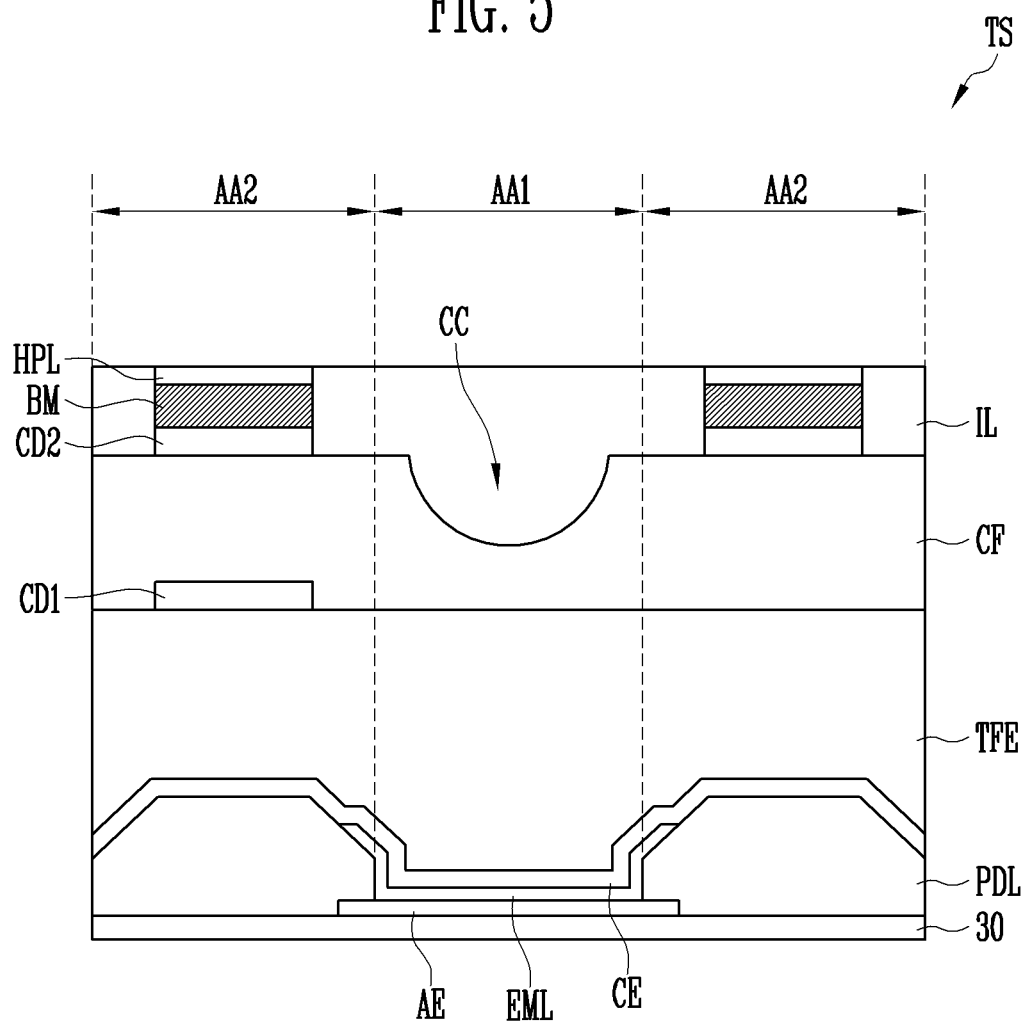
FIG. 5 is a sectional view illustrating a display device according to an embodiment of the present disclosure.

FIG. 5 is a sectional view illustrating a display device according to an embodiment of the present disclosure. FIGS. 6A-6F are sectional views illustrating a method of manufacturing the display device according to an embodiment of the present disclosure.

Referring to FIGS. 3, 5, and 6A-6F, a touch sensor TS may include a base layer TBL, a first conductive pattern CD1, a color filter CF, a second conductive pattern CD2, and a black matrix BM. The touch sensor TS may further include a hydrophobic layer HPL and an insulating layer IL.

In an embodiment, a display panel DP may be disposed on the bottom of the touch sensor TS.

A light emitting element may be disposed on an interlayer organic layer 30 of the display panel DP. The light emitting element may include a first electrode AE disposed on the interlayer organic layer 30, a second electrode CE disposed on the first electrode AE, and an emitting layer EML disposed between the first electrode AE and the second electrode CE.

In addition, a pixel defining layer PDL may be disposed on the interlayer organic layer 30. The pixel defining layer PDL may cover a portion of the first electrode AE. An opening region (see OP of FIG. 3) of the pixel defining layer PDL may correspond to a portion at which the first electrode AE is exposed from the pixel defining layer PDL. In an embodiment, a first region AA1 of the color filter CF may correspond to the opening region OP of the pixel defining layer PDL.

A specific stacking structure of the display panel DP has been described in detail with reference to FIG. 3, and therefore, its overlapping description will be omitted.

In an embodiment, the base layer TBL may be an uppermost layer of an encapsulation layer TFE of the display panel DP. For example, the base layer TBL may be an inorganic layer (or inorganic insulating layer) that is the uppermost layer of the encapsulation layer TFE. In an embodiment, the base layer TBL may be an inorganic layer (or inorganic buffer layer) additionally disposed on the encapsulation layer TFE. For example, the base layer TBL may include a silicon nitride layer, a silicon oxynitride layer, a silicon oxide layer, a titanium oxide layer, an aluminum oxide layer, or any other suitable inorganic layer.

Figure 6A:
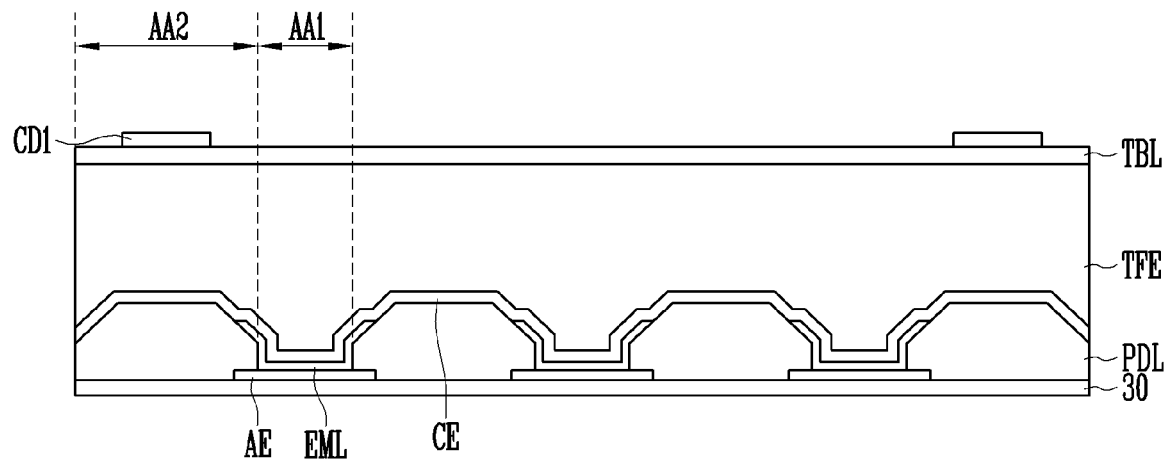
FIGS. 6A to 6F are sectional views illustrating a method of manufacturing the display device according to an embodiment of the present disclosure.

As shown in FIG. 6A, the first conductive pattern CD1 may be directly disposed on the base layer TBL, however, in other embodiments, the first conductive pattern CD1 may be indirectly disposed on the base layer TBL. The first conductive pattern CD1 may be disposed to overlap with the pixel defining layer PDL.

In an embodiment, the first conductive pattern CD1 may form first sensor parts SP1 and first connecting parts CP1, which are included in first sensing electrodes IE1-1 to IE1-5, and second sensor parts SP2 included in second sensing electrodes IE2-1 to IE2-4. The second conductive pattern CD2 may form second connecting parts CP2.

In an embodiment, the first conductive pattern CD1 may form the second connecting parts CP2. The second conductive pattern CD2 may form the first sensor parts SP1, the first connecting parts CP1, and the second sensor parts SP2. In an embodiment, the first sensor parts SP1 and the second sensor parts SP2 may have a mesh pattern configured with mesh lines each having a plurality of mesh holes. Therefore, the second conductive pattern CD2 shown in the drawings from FIG. 5 may be understood as a section (e.g., a cross-section) of a portion of the mesh line.

The first conductive pattern CD1 is a section of a portion of a conductive line forming the second connecting part CP2. For example, the second connecting part CP2 may also have a mesh pattern configured with mesh lines each having a plurality of mesh holes, and the first conductive pattern CD1 may be understood as a section of a portion of the mesh line constituting the second connecting part CP2. However, this is merely illustrative, and in some embodiments, the first conductive pattern CD1 constituting the second connecting part CP2 is not the mesh pattern but may be a simple conductive pattern or any other suitable pattern.

Each of the first conductive pattern CD1 and the second conductive pattern CD2 may have a single or multi-layered structure. The conductive pattern having the single-layered structure may, for example, include a metal layer or a transparent conductive layer. The metal layer may include molybdenum, silver, titanium, copper, aluminum, and alloys thereof. The transparent conductive layer may include a transparent conductive oxide such as indium tin oxide (ITO), indium zinc oxide (IZO), zinc oxide (ZnO), or indium tin zinc oxide (ITZO). In addition, the transparent conductive layer may include conductive polymer such as PEDOT, metal nano wire, graphene, etc. The conductive pattern having the multi-layered structure may include multi-layered metal layers. The multi-layered metal layers may have a triple structure of, for example, titanium/aluminum/titanium. The described single and multi-layered structures are merely provided for example, and any other suitable single or multi-layered structure and materials may be used as one skilled in the art would appreciate.

In an embodiment, the first conductive pattern CD1 may be formed to overlap with the pixel defining layer PDL through patterning using a mask.

Figure 6B:
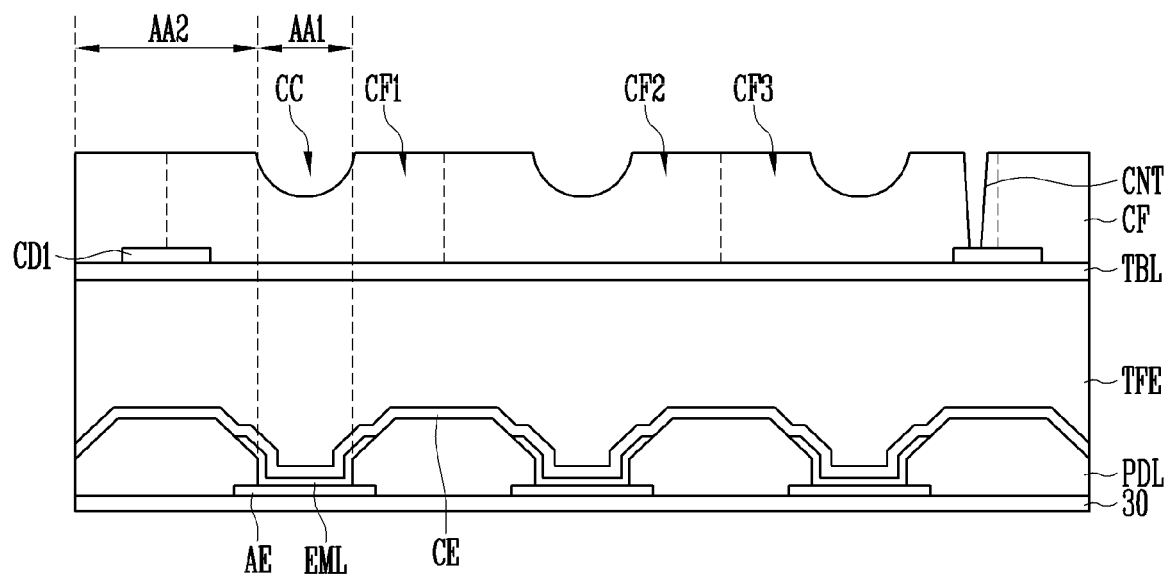
Figure 6C:
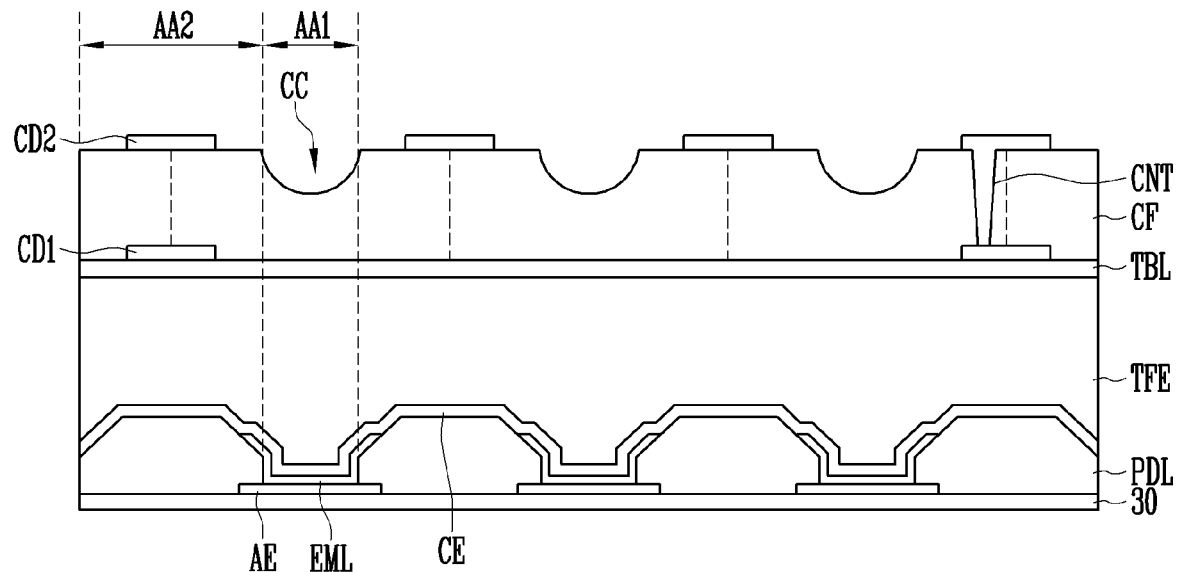
Figure 6D:
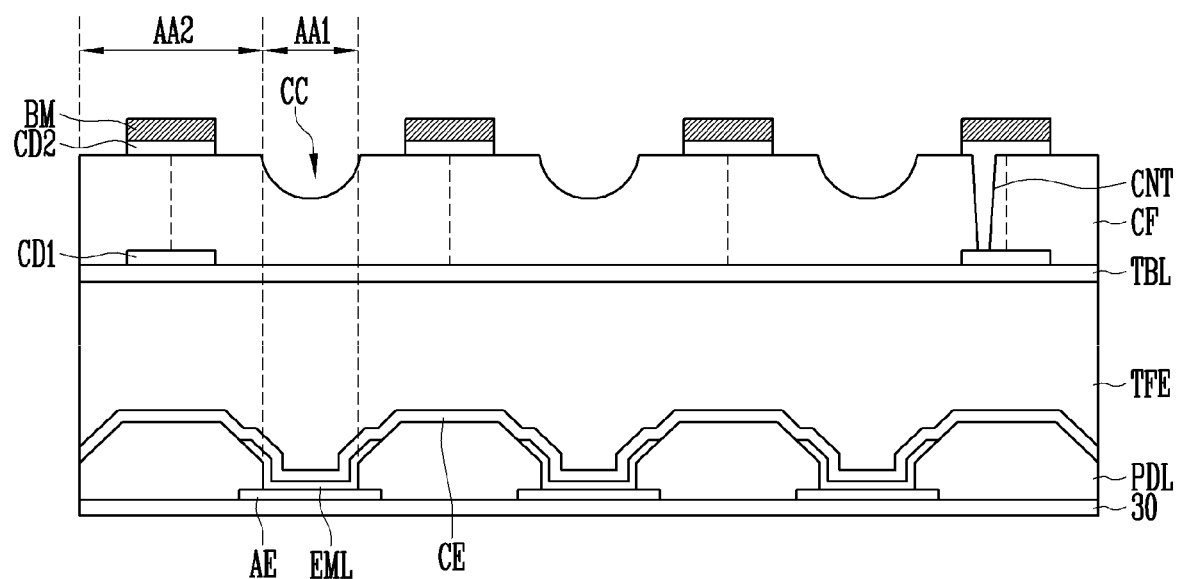

As shown in FIG. 6D, the color filter CF may include the first region AA1 overlapping with the opening region OP (e.g., of FIG. 3) of the pixel defining layer PDL and a second region AA2 overlapping with the pixel defining layer PDL. The color filter CF may be disposed on the encapsulation layer TFE to cover the first conductive pattern CD1.

In an embodiment, a contact hole CNT may be formed at a portion of the second region AA2 of the color filter CF. The contact hole CNT may be formed to expose a portion of the first conductive pattern CD1.

The color filter CF may include color filters CF1, CF2, and CF3 of a plurality of color groups. For example, the color filter CF may include red color filters, green color filters, and blue color filters. For example, a first color filter CF1 may be a red color filter, a second color filter CF2 may be a green color filter, and a third color filter CF3 may be a blue color filter.

The color filters CF1, CF2, and CF3 may be disposed corresponding to opening regions of pixels and colors of lights emitted by the respective pixels. That is, although a case where a boundary of each of the first to third color filters CF1, CF2, and CF3 corresponds to a central portion of the pixel defining layer PDL is illustrated in FIG. 6B, the arrangement of the first to third color filters CF1, CF2, and CF3 is not limited thereto. For example, the first to third color filters CF1, CF2, and CF3 may be arranged to cover all the opening regions of the respective pixels. The first to third color filters CF1, CF2, and CF3 may have different areas.

The color filter CF may include a lens part in the first region AA1. In an embodiment, the color filter CF may include a concave part (or concave lens) CC that is concave toward the light emitting element. The width of the concave part CC may be formed not to be out of the first region AA1 (e.g., entirely in the first region AA1). In an embodiment, the width of the concave part CC may be smaller than that of the opening region OP of the pixel defining layer PDL, which overlaps with the concave part CC.

In an embodiment, the concave part CC may have a concave lens shape. The concave part CC condenses light emitted to the outside of the display device DD from the light emitting element, and thus the light efficiency of the emitted light can be increased.

However, the shape of the concave part CC is not limited thereto. For example, the concave part CC may be a recess having a thickness smaller than that of the second region AA2. Also, the planar shape of the concave part CC may be at least one of a circular shape, an elliptical shape, a polygonal shape or any other suitable shape. That is, the concave part CC may be designed to have a shape, a taper angle, a breadth, and width, where the condensing effect and light efficiency of the concave part CC can be increased (e.g., maximized).

In an embodiment, a top surface of the second region AA2 of the color filter CF may be substantially flat.

The color filter CF may include a contact hole CNT located at a portion of the second region AA2. The contact hole CNT may expose a portion of a top surface of the first conductive pattern CD1.

The color filter CF may be formed of an organic insulating material. In an embodiment, the color filter CF including the concave part CC and the contact hole CNT may be formed, for example, through a photo process using a mask. For example, the color filter CF may be formed by performing a mask process three times, using masks respectively corresponding to the red color filters, the green color filters, and the blue color filters. In an example, a halftone mask may be applied to the concave part CC such that only a portion of the color filter CF is etched. In addition, the contact hole CNT may be patterned together with the concave part CC.

In an embodiment, the organic material of the color filter CF may be a material that can be deposited at a low temperature (e.g., 90° C. or lower). The deposition of the organic material may be performed, for example, at a low temperature of 90° C. or lower. When the deposition of the organic material is performed at the low temperature, various elements or layers previously formed in the process of depositing the organic material can be prevented from being damaged. On the other hand, the material selection freedom of various elements or layers may increase.

As shown in FIG. 6C, the second conductive pattern CD2 may be formed on the second region AA2 of the color filter CF. In an embodiment, the second conductive pattern CD2 may form the first sensor parts SP1, the first connecting parts CP1, and the second sensor parts SP2. In an embodiment, the second conductive pattern CD2 may form the second connecting parts CP2.

The second conductive pattern CD2 may include a metal layer or a transparent conductive layer, which has a single- or multi-layered structure.

In an embodiment, the first conductive pattern CD1 and the second conductive pattern CD2 may be electrically connected through the contact hole CNT. For example, after the contact hole CNT is formed in the color filter CF, the second conductive pattern CD2 may be formed on the color filter CF through patterning using a mask.

The black matrix BM may be disposed on the second conductive pattern CD2. As shown in FIG. 6D, the black matrix BM may be formed on a top surface of the second conductive pattern CD2.

The black matrix BM may include a material capable of blocking light. For example, the black matrix BM may include an organic material having high light absorption. The black matrix BM may include a black pigment or black dye. The black matrix BM may include a photosensitive organic material. For example, the black matrix BM may include a coloring agent such as a pigment or dye. The black matrix BM may have a single- or multi-layered structure.

The black matrix BM may be formed on the second conductive pattern CD2 through patterning using a mask. In an embodiment, the black matrix BM may cover even a side surface of the second conductive pattern CD2.

In an embodiment, the black matrix BM may have a width smaller than that of the pixel defining layer PDL overlapping therewith. Accordingly, light emitted from the light emitting element can be widely spread without interruption of the black matrix BM. Thus, the viewing angle can be increased, and the luminance ratio can be considerably improved.

Figure 6E:
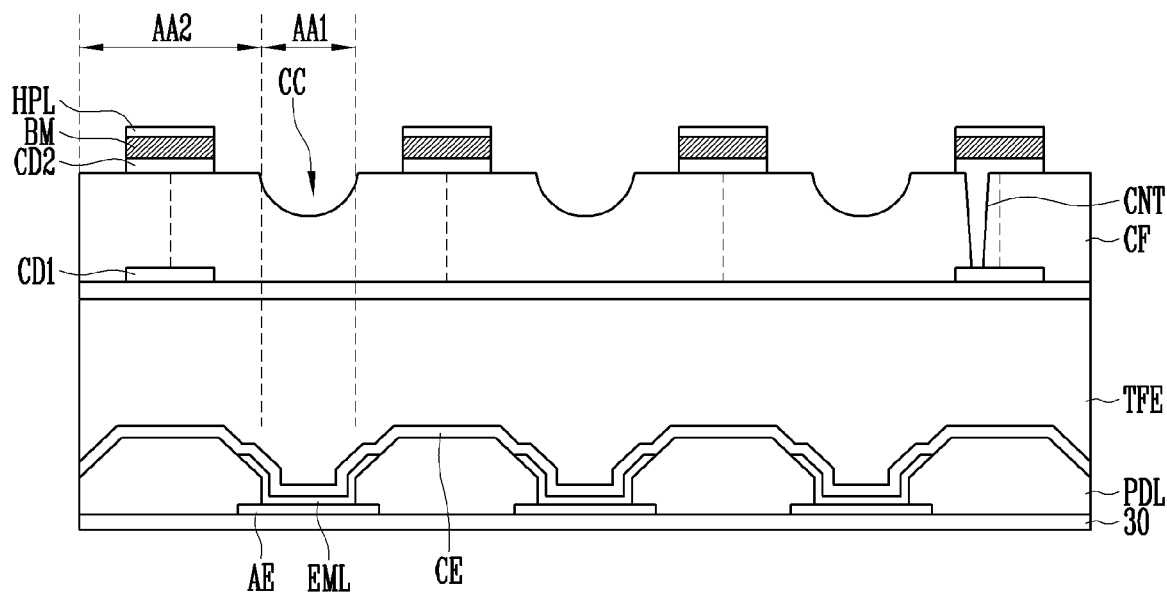

The hydrophobic layer HPL may be disposed on the black matrix BM. As shown in FIG. 6E, the hydrophobic layer HPL may be formed on the black matrix BM.

The hydrophobic layer HPL may include a liquid-repellent organic material. For example, the hydrophobic layer HPL may include a fluorinated silane-based material, a fluorinated acryl-based material, a fluorinated alkyl-based material, and/or any other suitable material.

The hydrophobic layer may have an area smaller than or equal to that of the black matrix BM. Accordingly, the hydrophobic layer HPL prevents the insulating layer IL formed in a subsequent process from being formed on top of the hydrophobic layer HPL. Thus, the thickness of the insulating layer IL for covering the second conductive pattern CD2 and the black matrix BM can be considerably decreased.

The hydrophobic layer HPL may be formed by patterning the liquid-repellent organic material using a mask. However, this is merely illustrative, and the process of forming the hydrophobic layer HPL is not limited thereto.

Figure 6F:
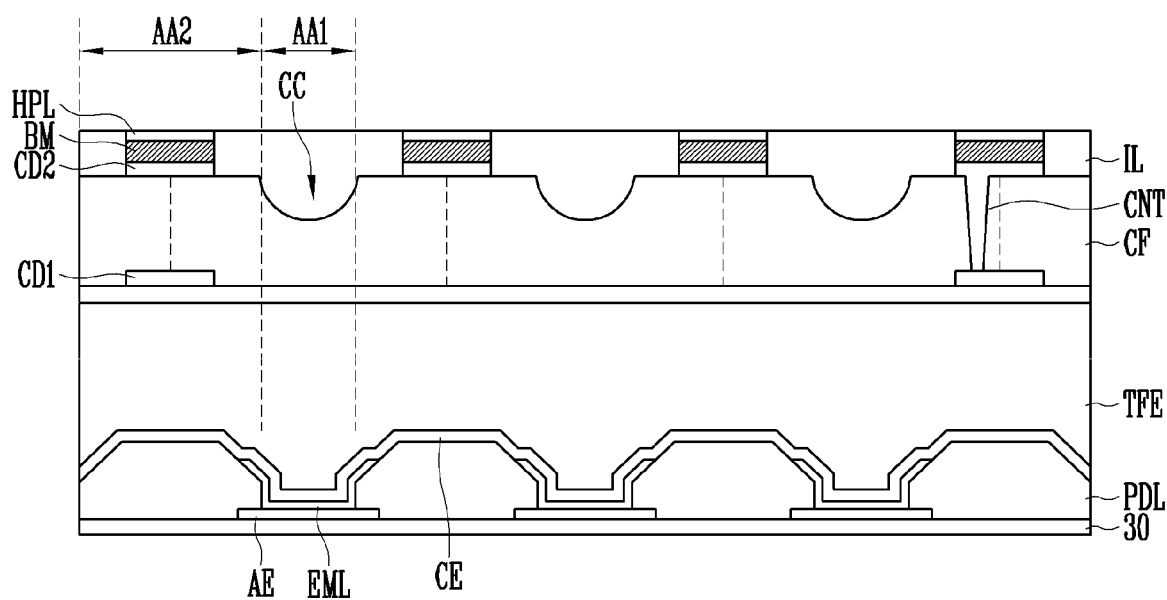

The insulating layer IL may be disposed on the color filter CF on which the hydrophobic layer HPL is formed. As shown in FIG. 6F, the insulating layer IL may be formed on the color filter CF exposed from the second conductive pattern CD2 and the black matrix BM.

The insulating layer IL does not overlap with top surfaces of the second conductive pattern CD2, the black matrix BM, and the hydrophobic layer HPL. That is, the insulating layer IL is not formed on the hydrophobic layer HPL. Accordingly, a top surface of the insulating layer IL is not higher than that of the hydrophobic layer HPL. For example, any height difference (e.g., a step difference) hardly exists between the insulating layer IL and the hydrophobic layer HPL, and the insulating layer IL may have a flat top surface.

In an embodiment, the insulating layer IL may include an organic insulating material.

In an embodiment, the insulating layer IL may be formed through an inkjet printing process. For example, the insulating layer IL may be formed through an inkjet printing process such as thermal inkjet printing or piezo inkjet printing.

Accordingly, the existing mask process for forming the insulating layer is replaced with the inkjet printing process. Thus, at least one mask process may be omitted, and manufacturing cost can be reduced.

A window unit (e.g., window panel) or a functional panel may be disposed on the insulating layer IL and the hydrophobic layer HPL or be attached to the insulating layer IL and the hydrophobic layer HPL through a transparent adhesive member.

As described above, in the touch sensor TS, the method of manufacturing the same, and the display device including the same according to the embodiment of the present disclosure, the color filter CF is disposed between the first conductive pattern CD1 and the second conductive pattern CD2, and the insulating layer IL is not formed over the black matrix BM, so that the thickness of the touch sensor TS can be decreased. In various embodiments, the display device may be a bendable or flexible display device. The shape of a flexible display device applied to a foldable display device and the like can be easily modified.

Further, the color filter CF between the first conductive pattern CD1 and the second conductive pattern CD2 includes the concave part CC overlapping with the opening region OP of the pixel defining layer PDL, so that the light characteristic (e.g., light efficiency) of light emitted from the light emitting element can be improved.

In addition, in the manufacturing method of the touch sensor TS according to the embodiment of the present disclosure, a mask process for forming an organic layer/inorganic layer is omitted, so that manufacturing cost can be reduced.

FIG. 7 is a sectional view illustrating an example of the touch sensor included in the display device of FIG. 2.

In FIG. 7, components identical to those described with reference to FIG. 5 are designated by like reference numerals, and their overlapping descriptions will be omitted. In addition, the touch sensor TS1 of FIG. 7 may have a configuration substantially identical or similar to that of the touch sensor TS of FIG. 5, except a black matrix BM1.

Referring to FIG. 7, the touch sensor TS1 may include a base layer TBL, a first conductive pattern CD1, a color filter CF, a second conductive pattern CD2, a black matrix BM1, a hydrophobic layer HPL, and an insulating layer IL.

In an embodiment, the black matrix BM1 may be disposed to cover both top and side surfaces of the second conductive pattern CD2. When the width of the black matrix BM1 increases, the reflexibility of external light may be reduced. Thus, the deterioration of visibility due to light reflection can be reduced or minimized.

In an embodiment, the width CCA of a concave part (e.g., a concave lens) CC may be smaller than that of a first region AA1. That is, the area of the concave part CC is smaller than that of the first region AA1. The concave part CC is formed not to be out of the first region AA1 (i.e., an opening region of a pixel).

Figure 8:
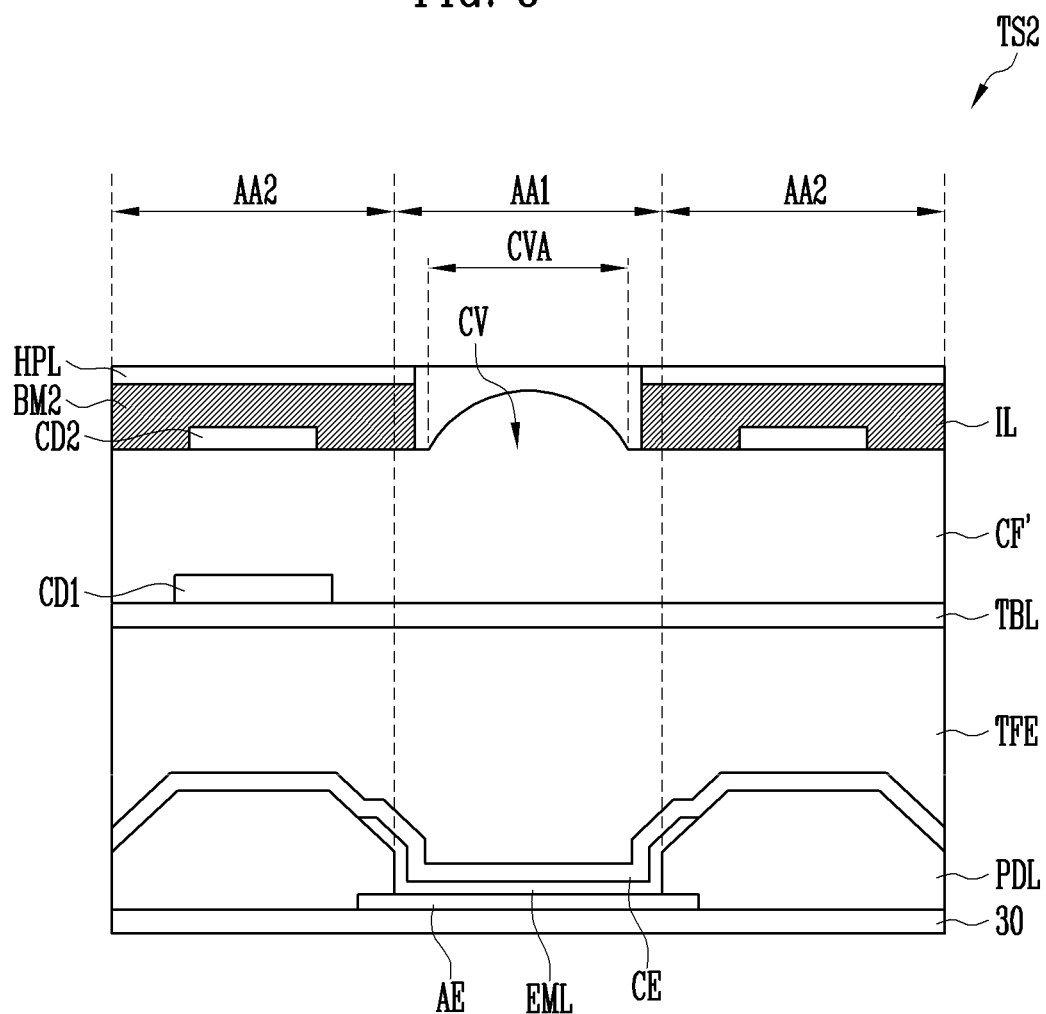
FIG. 8 is a sectional view illustrating an example of the touch sensor included in the display device of FIG. 2.

FIG. 8 is a sectional view illustrating an example of the touch sensor included in the display device of FIG. 2.

In FIG. 8, similar components (e.g., identical) to those described with reference to FIG. 5 are designated by like reference numerals, and their overlapping descriptions will be omitted. In addition, the touch sensor TS2 of FIG. 8 may have a configuration substantially identical or similar to that of the touch sensor TS of FIG. 5, except a color filter CF' and a black matrix BM2.

Referring to FIG. 8, the touch sensor TS2 may include a base layer TBL, a first conductive pattern CD1, a color filter CF', a second conductive pattern CD2, a black matrix BM2, a hydrophobic layer HPL, and an insulating layer IL.

The color filter CF' may include a lens part in a first region AA'. In an embodiment, the color filter CF' may include a protrusion part CV (i.e., a convex lens), which protrudes further than a second region AA2 from the lens part. For example, the protrusion part CV may have a convex lens shape. The protrusion part CV may widely scatter light emitted from a light emitting element. Accordingly, the viewing angle can be increased, and the luminance ratio can be improved.

In an embodiment, the width CVA of the protrusion part CV may be smaller than that of the first region AA1. That is, the area of the protrusion part CV is smaller than that of the first region AA1, and the protrusion part CV is formed not to be out of the first region AA1 (i.e., an opening region of a pixel).

In an embodiment, the width of the black matrix BM2 may be larger than that of a pixel defining layer PDL overlapping therewith. That is, the black matrix BM2 may overlap with a portion of the opening region OP of the pixel defining layer PDL. Accordingly, the area of the black matrix BM2 is widened, and hence the reflexibility of light can be reduced. Thus, the deterioration of visibility due to light reflection can be minimized.

Further, light is scattered by the protrusion part CV having the convex lens shape, and thus the decrease in viewing angle due to an increase in area of the black matrix BM2 can be solved.

Accordingly, in the touch sensor TS according to the embodiment of the present disclosure, its reflexibility and viewing angle can be improved.

As described above, in the touch sensor TS, TS1 or TS2 and the display device DD including the same according to the embodiment of the present disclosure, the color filter CF or CF' may be disposed between the first conductive pattern CD1 and the second conductive pattern CD2, and the insulating layer IL may be formed to not run over the black matrix BM, BM1 or BM2, so that the thickness of the touch sensor TS, TS1 or TS2 can be decreased. Thus, the shape of a flexible display device applied to a foldable display device and the like can be easily modified.

In the touch sensor, the method of manufacturing the same, and the display device including the same according to the present disclosure, a color filter is disposed between a first conductive pattern and a second conductive pattern, and an insulating layer is formed not to run over a black matrix, so that the thickness of the touch sensor can be decreased. Thus, the shape of a flexible display device applied to a foldable display device and the like can be easily modified.

Further, the color filter between the first conductive pattern and the second conductive pattern includes a concave part (e.g., a concave lens) or a protrusion part (convex lens), which overlaps with an opening region of a pixel defining layer, so that the light characteristic (e.g., light efficiency) of light emitted from a light emitting element can be improved.

In the method of manufacturing the touch sensor according to the present disclosure, a mask process for forming an organic layer/inorganic layer is omitted, so that manufacturing cost can be reduced.

Example embodiments have been disclosed herein, and although specific terms are employed, they are used and are to be interpreted in a generic and descriptive sense only and not for purpose of limitation. In some instances, as would be apparent to one of ordinary skill in the art as of the effective filing date of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present disclosure as set forth in the following claims and their equivalents.

What is claimed is:

1. A display device comprising:
a display panel comprising an emission region and a non-emission region; and
a touch sensor on the display panel,
wherein the display panel comprises:
a base layer;
a light emitting element on the base layer, the light emitting element comprising a first electrode;
a pixel defining layer comprising an opening region that exposes a portion of the first electrode of the light emitting element; and
an encapsulation layer covering the light emitting element and the pixel defining layer,
wherein the touch sensor comprises:
a first conductive pattern on the encapsulation layer;
a color filter on the encapsulation layer to cover the first conductive pattern, the color filter having a first region and a second region, wherein the first region comprises a lens part and overlaps with the opening region of the pixel defining layer, and the second region overlaps with the pixel defining layer;
a second conductive pattern on the second region of the color filter; and
a black matrix on the second conductive pattern, and
wherein a width of the lens part is smaller than a width of the opening region of the pixel defining layer that overlaps with the lens part, wherein the touch sensor further comprises:
a hydrophobic layer on the black matrix; and
an insulating layer on the color filter, and
wherein the insulating layer does not overlap with the second conductive pattern, the black matrix, and the hydrophobic layer.

2. The display device of claim 1, wherein the lens part of the color filter has a concave lens shape that is concave toward the light emitting element.

3. The display device of claim 2, wherein a width of the black matrix is smaller than a width of the pixel defining layer overlapping with the black matrix.

4. The display device of claim 2, wherein the black matrix covers a side surface of the second conductive pattern.

5. The display device of claim 1, wherein the lens part of the color filter has a convex lens shape that protrudes further than the second region.

6. The display device of claim 5, wherein a width of the black matrix is larger than a width of the pixel defining layer overlapping with the black matrix.

7. The display device of claim 6, wherein the black matrix overlaps with a portion of the opening region of the pixel defining layer.

8. The display device of claim 1, wherein the color filter has a contact hole in the second region and exposes a portion of the first conductive pattern.

9. The display device of claim 8, wherein the first conductive pattern is electrically connected to the second conductive pattern through the contact hole.

10. The display device of claim 1, wherein the light emitting element further comprises:
a second electrode on the first electrode; and
an emitting layer between the first electrode and the second electrode.

11. The display device of claim 10, wherein the pixel defining layer covers a portion of the first electrode, and the opening region of the pixel defining layer corresponds to a portion of the first electrode that is exposed from the pixel defining layer.

12. A method of manufacturing a display device, the method comprising:
patterning a first conductive pattern on a display panel;
forming a color filter through a photo process, wherein the color filter comprises a first region comprising a lens part on the display panel and the first conductive pattern, a second region at the periphery of the first region, and a contact hole formed at a portion of the second region;
patterning a second conductive pattern on the second region of the color filter;
forming a black matrix on the second conductive pattern;
forming a hydrophobic layer on the black matrix; and
forming an insulating layer at a portion of the color filter, wherein the insulating layer is exposed from the second conductive pattern and the black matrix.

13. The method of claim 12, wherein the insulating layer is formed through an inkjet printing process, and
wherein the insulating layer does not overlap with the second conductive pattern, the black matrix, and the hydrophobic layer.

14. The method of claim 12, wherein the lens part of the color filter has a concave lens shape that is concave toward the display panel.

15. The method of claim 12, wherein the lens part of the color filter has a convex lens shape that protrudes further than the second region.

16. A display device comprising:
a display panel comprising an emission region and a non-emission region; and
a touch sensor on the display panel,
wherein the display panel comprises:
a base layer;
a light emitting element on the base layer, the light emitting element comprising a first electrode;
a pixel defining layer comprising an opening region that exposes a portion of the first electrode of the light emitting element; and
an encapsulation layer covering the light emitting element and the pixel defining layer,
wherein the touch sensor comprises:
a first conductive pattern on the encapsulation layer;
a color filter on the encapsulation layer to cover the first conductive pattern, the color filter having a first region and a second region, wherein the first region comprises a lens part and overlaps with the opening region of the pixel defining layer, and the second region overlaps with the pixel defining layer;
a second conductive pattern on the second region of the color filter;
a black matrix on the second conductive pattern;
a hydrophobic layer on the black matrix; and
an insulating layer on the color filter, and
wherein the insulating layer does not overlap with the second conductive pattern, the black matrix, and the hydrophobic layer.

* * * * *